US012670869B2

(12) United States Patent　　　　(10) Patent No.:　US 12,670,869 B2
　　　Kim et al.　　　　　　　　　　　　(45) Date of Patent:　　Jun. 30, 2026

(54) DISPLAY DEVICE AND METHOD OF CONTROLLING THE SAME

(71) Applicant: LG Display Co., Ltd., Seoul (KR)

(72) Inventors: Ji Hwan Kim, Paju-si (KR); Dong Soo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/978,551

(22) Filed: Dec. 12, 2024

(65) Prior Publication Data

US 2025/0252930 A1　Aug. 7, 2025

(30) Foreign Application Priority Data

Feb. 1, 2024　(KR) ........................ 10-2024-0015778

(51) Int. Cl.
　　*G09G 3/3266*　　　(2016.01)
　　*G09G 3/36*　　　　(2006.01)
　　*G11C 19/28*　　　(2006.01)
(52) U.S. Cl.
　　CPC ......... *G09G 3/3266* (2013.01); *G09G 3/3674* (2013.01); *G09G 3/3677* (2013.01); *G09G 3/3696* (2013.01); *G11C 19/287* (2013.01); *G09G 2310/0243* (2013.01); *G09G 2310/0267* (2013.01); *G09G 2310/0286* (2013.01); *G09G 2330/021* (2013.01); *G09G 2330/027* (2013.01)
(58) Field of Classification Search
　　CPC ....... G09G 2330/021; G09G 2330/027; G09G 2330/028; G09G 2310/0289; G09G 3/3266; G09G 2310/0286; G09G 3/3677; G09G 3/3696; G09G 3/3674; G09G 2310/0267; G09G 2310/0243; G09G 2310/0202; G09G 2310/0251; G09G 2330/04; G11C 19/287
　　See application file for complete search history.

(56) References Cited

U.S. PATENT DOCUMENTS

| | | | | |
|---|---|---|---|---|
| 2010/0171728 | A1* | 7/2010 | Han ..................... | H03K 17/162 345/87 |
| 2010/0182305 | A1* | 7/2010 | Fang .................... | G09G 3/3677 345/212 |
| 2011/0267326 | A1* | 11/2011 | Kim ..................... | G09G 3/3677 327/108 |
| 2015/0269900 | A1* | 9/2015 | Iwamoto .............. | G09G 3/3648 345/100 |
| 2016/0155406 | A1* | 6/2016 | Lee ..................... | G09G 3/3659 345/212 |

(Continued)

*Primary Examiner* — Dismery Mercedes
(74) *Attorney, Agent, or Firm* — Morgan, Lewis & Bockius LLP

(57)　　　　　　ABSTRACT

A display device includes a display panel, a gate driving circuit having a plurality of stages, and a power supply for sequentially applying first to third discharge signals in a power off mode, wherein an n-th stage includes a pull-up transistor that outputs a high-voltage gate signal in a driving mode, a pull-down transistor that outputs a low-voltage gate signal in the driving mode and discharges a gate signal output node in response to the second discharge signal in the power off mode, a Q node discharge transistor that charges and discharges the Q node and the QB node in the driving mode and discharges the Q node in response to the second discharge signal in the power off mode, and a QB node discharge transistor that discharges the QB node in response to the third discharge signal in the power off mode.

15 Claims, 13 Drawing Sheets

(56) References Cited

U.S. PATENT DOCUMENTS

| | | | | |
|---|---|---|---|---|
| 2016/0155409 | A1* | 6/2016 | Jeoung | G09G 3/3696 |
| | | | | 345/214 |
| 2019/0287447 | A1* | 9/2019 | Zheng | G11C 19/28 |
| 2020/0035182 | A1* | 1/2020 | Bae | G11C 19/28 |
| 2020/0035189 | A1* | 1/2020 | Zhang | H03K 17/6871 |
| 2020/0202807 | A1* | 6/2020 | Shao | G09G 3/3266 |
| 2020/0357317 | A1* | 11/2020 | Wang | G09G 3/20 |
| 2021/0150957 | A1* | 5/2021 | Liao | G11C 19/28 |

* cited by examiner

< EMBODIMENT >          < COMPARATIVE EXAMPLE >

DISPLAY DEVICE AND METHOD OF CONTROLLING THE SAME

CROSS-REFERENCE TO RELATED APPLICATIONS

This application claims the benefit of and priority to Korean Patent Application No. 10-2024-0015778, filed on Feb. 1, 2024, the entire contents of which are incorporated herein by reference for all purposes, as if fully set forth herein.

BACKGROUND

1. Technical Field

The present disclosure relates to a display device and a method of controlling the same.

2. Discussion of the Related Art

A display device may include a plurality of subpixels disposed on a panel and various circuits that drive the plurality of subpixels. For example, a display device may include a gate driving circuit that controls driving timing of a plurality of subpixels and a data driving circuit that supplies data voltages corresponding to image data to the plurality of subpixels.

The gate driving circuit may be composed of a plurality of switches and lines for supplying gate pulses to a plurality of gate lines. This gate driving circuit may be formed directly on the same substrate along with the subpixels of the display panel. Since the gate driving circuit is disposed in a bezel area outside an active area, the size of the bezel area inevitably increases as the gate driving circuit becomes more complicated.

Therefore, research is continuing to maximize the efficiency of a design area by simplifying the gate driving circuit while securing the performance of the gate driving circuit to reduce the design area.

The description of the related art should not be assumed to be prior art merely because it is mentioned in or associated with this section. The description of the related art includes information that describes one or more aspects of the subject technology, and the description in this section does not limit the invention.

SUMMARY

Accordingly, one or more aspects of the present disclosure are directed to a display device and a method of driving the same that substantially obviate one or more problems due to limitations and disadvantages of the related art.

An aspect of the present disclosure is to provide a display device and a method of driving the same to reduce a design area by simplifying a gate driving circuit while securing the performance of the gate driving circuit.

Additional advantages, aspects, and features of the present disclosure will be set forth in part in the description which follows and in part will become apparent to those having ordinary skill in the art upon examination of the following or may be learned from practice of the present disclosure. The objectives and other advantages of the present disclosure may be realized and attained by the structure particularly pointed out in the written description and claims hereof as well as the appended drawings.

To achieve these aspects and other advantages and in accordance with one or more example embodiments of the present disclosure, as embodied and broadly described herein, a display device includes a display panel, a gate driving circuit having a plurality of stages for providing a gate signal to the display panel, and a power supply configured to sequentially apply first to third discharge signals in a power off mode in which the gate driving circuit is powered off, wherein an N-th stage among the stages includes a pull-up transistor configured to output a high-voltage gate signal through a gate signal output node according to a voltage of a Q node in a driving mode in which the gate signal is output, a pull-down transistor connected to the pull-up transistor through the gate signal output node and configured to output a low-voltage gate signal through the gate signal output node according to a voltage of a QB node in the driving mode and to discharge the gate signal output node in response to the second discharge signal applied to the QB node in the power off mode, a Q node discharge transistor configured to charge and discharge the Q node and the QB node in opposite manners according to the voltage of the QB node in the driving mode and to discharge the Q node in response to the second discharge signal applied to the QB node in the power off mode, and a QB node discharge transistor configured to discharge the QB node in response to the third discharge signal in the power off mode.

The display device may further include a pull-up carry transistor configured to output a high-voltage carry signal through a carry signal output node according to the voltage of the Q node in the driving mode in which the gate signal is output, and a pull-down carry transistor connected to the pull-up carry transistor through the carry signal output node and configured to output a low-voltage carry signal through the carry signal output node according to the voltage of the QB node in the driving mode and to discharge the carry signal output node in response to the second discharge signal applied to the QB node in the power off mode.

The first discharge signal may be applied to all input terminals of the N-th stage when the gate driving circuit is powered off.

The first to third discharge signals may have the same high voltage level and are sequentially applied with a preset time difference therebetween.

The power supply may apply the first discharge signal to all input terminals of the N-th stage for a first time when the gate driving circuit is powered off, apply the second discharge signal to the QB node for a second time when application of the first discharge signal is completed, and apply the third discharge signal to a gate electrode of the Q node discharge transistor for a third time when application of the second discharge signal is completed.

The first time, the second time, and the third time may be set to the same time.

The input terminals may include a start signal/carry signal (VST/CRY) input terminal, a high-voltage power (VDD) input terminal, a clock signal (CLK) input terminal, a stable signal input terminal, a first low-voltage power (VSS) input terminal, and a second low-voltage power (VGL) input terminal.

The power supply may apply high-voltage power to a power input terminal of the QB node in the driving mode, and apply the second discharge signal to the QB node when the gate driving circuit is powered off.

The display device may further include a power line connected to the pull-down transistor, the pull-down carry transistor, the Q node discharge transistor, and the QB node discharge transistor, wherein low-voltage power is applied to the power line in the driving mode, and the first discharge signal is applied to the power line when the gate driving circuit is powered off.

The Q node discharge transistor may include a gate electrode to which the second discharge signal is input, a first electrode connected to the QB node, and a second electrode connected to the power line through which low-voltage power is input in the driving mode and the first discharge signal is input when the gate driving circuit is powered off.

In another aspect of the present disclosure, a method of controlling a display device including a display panel and a gate driving circuit having a plurality of stages for providing a gate signal to the display panel includes, when the gate driving circuit is powered off, applying a first discharge signal to all input terminals of the gate driving circuit, discharging a Q node and a gate signal output node by applying a second discharge signal to a QB node of an N-th stage included in the gate driving circuit, and applying a third discharge signal to a QB node discharge transistor configured to discharge the QB node.

The N-th stage may include a pull-up transistor configured to output a high-voltage gate signal through the gate signal output node according to a voltage of the Q node in a driving mode in which the gate signal is output, a pull-down transistor connected to the pull-up transistor through the gate signal output node and configured to output a low-voltage gate signal through the gate signal output node according to a voltage of the QB node in the driving mode and to discharge the gate signal output node in response to the second discharge signal applied to the QB node in a power off mode in which the gate driving circuit is powered off, a pull-up carry transistor configured to output a high-voltage carry signal through a carry signal output node according to the voltage of the Q node in the driving mode in which the gate signal is output, a pull-down carry transistor connected to the pull-up carry transistor through the carry signal output node and configured to output a low-voltage carry signal through the carry signal output node according to the voltage of the QB node in the driving mode and to discharge the carry signal output node in response to the second discharge signal applied to the QB node in the power off mode, a Q node discharge transistor configured to charge and discharge the Q node and the QB node in opposite manners according to the voltage of the QB node in the driving mode and to discharge the Q node in response to the second discharge signal applied to the QB node in the power off mode, and a QB node discharge transistor configured to discharge the QB node in response to the third discharge signal in the power off mode.

The first to third discharge signals may have the same high voltage level and are sequentially applied with a preset time difference therebetween.

The input terminals may include a start signal/carry signal (VST/CRY) input terminal, a high-voltage power (VDD) input terminal, a clock signal (CLK) input terminal, a stable signal input terminal, a first low-voltage power (VSS) input terminal, and a second low-voltage power (VGL) input terminal.

Additional features, advantages, and aspects of the present disclosure are set forth in part in the description that follows and in part will become apparent from the present disclosure or may be learned by practice of the inventive concepts provided herein. Other features, advantages, and aspects of the present disclosure may be realized and attained by the descriptions provided in the present disclosure, or derivable therefrom, and the claims hereof as well as the drawings. It is intended that all such features, advantages, and aspects be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing description and the following description of the present disclosure are examples, and are intended to provide further explanation of the present disclosure as claimed.

BRIEF DESCRIPTION OF THE DRAWINGS

The accompanying drawings, which are included to provide a further understanding of the present disclosure, are incorporated in and constitute a part of this disclosure, illustrate aspects and embodiments of the present disclosure, and together with the description serve to explain principles and examples of the present disclosure. In the drawings:

FIGS. 5 and 6 are diagrams for describing the power off sequence operation according to the driving waveforms of FIG. 4;

FIG. 7 is a diagram showing a circuit configuration of an N-th stage in a gate driving circuit included in the display device according to an aspect of the present disclosure;

FIGS. 9 to 11 are diagrams for describing the power off sequence operation according to the driving waveforms of FIG. 8;

Figure 1:
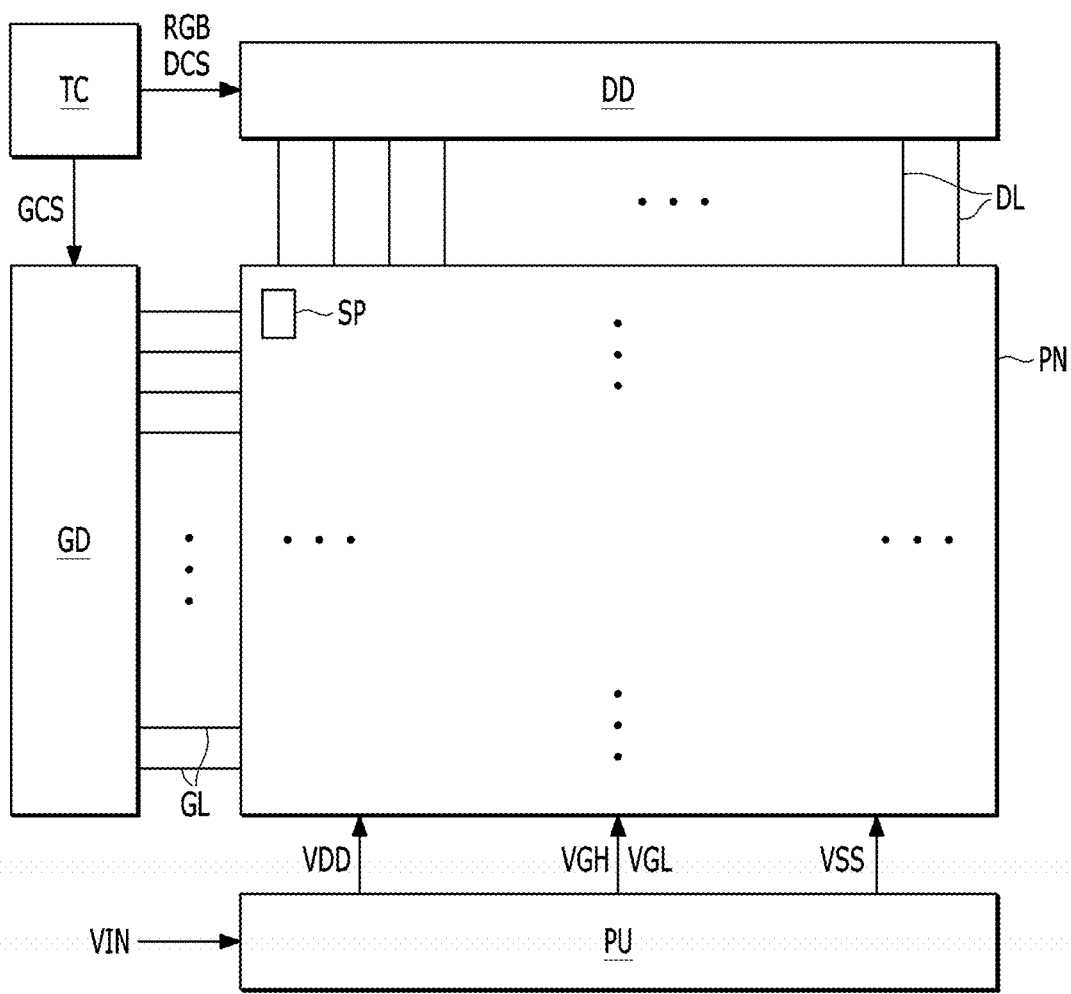
FIG. 1 is a schematic configuration diagram of a display device according to an aspect of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and/or convenience.

DETAILED DESCRIPTION

Reference is now made in detail to embodiments of the present disclosure, examples of which may be illustrated in the accompanying drawings. In the following description, when a detailed description of well-known methods, functions, structures or configurations may unnecessarily obscure aspects of the present disclosure, the detailed description thereof may have been omitted for brevity.

Further, repetitive descriptions may be omitted for brevity. The progression of processing steps and/or operations described is a non-limiting example.

The sequence of steps and/or operations is not limited to that set forth herein and may be changed to occur in an order that is different from an order described herein, with the exception of steps and/or operations necessarily occurring in a particular order. In one or more examples, two operations in succession may be performed substantially concurrently, or the two operations may be performed in a reverse order or in a different order depending on a function or operation involved.

Unless stated otherwise, like reference numerals may refer to like elements throughout even when they are shown in different drawings. Unless stated otherwise, the same reference numerals may be used to refer to the same or substantially the same elements throughout the specification and the drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the present disclosure.

Shapes, dimensions (e.g., sizes, lengths, widths, heights, thicknesses, locations, radii, diameters, and areas), proportions, ratios, angles, numbers, the number of elements, and the like disclosed herein, including those illustrated in the drawings, are merely examples, and thus, the present disclosure is not limited to the illustrated details. It is, however, noted that the relative dimensions of the components illustrated in the drawings are part of the present disclosure.

When the term "comprise," "have," "include," "contain," "constitute," "made of," "formed of," "composed of," or the like is used with respect to one or more elements (e.g., layers, films, components, sections, members, parts, regions, areas, portions, steps, operations, and/or the like), one or more other elements may be added unless a term such as "only" or the like is used. The terms used in the present disclosure are merely used in order to describe particular example embodiments, and are not intended to limit the scope of the present disclosure. The terms of a singular form may include plural forms unless the context clearly indicates otherwise. For example, an element may be one or more elements. An element may include a plurality of elements. The word "exemplary" is used to mean serving as an example or illustration. Embodiments are example embodiments. Aspects are example aspects. In one or more implementations, "embodiments," "examples," "aspects," and the like should not be construed to be preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term "may" encompasses all the meanings of the term "can."

In one or more aspects, unless explicitly stated otherwise, an element, feature, or corresponding information (e.g., a level, range, dimension, size, or the like) is construed to include an error or tolerance range even where no explicit description of such an error or tolerance range is provided. An error or tolerance range may be caused by various factors (e.g., process factors, internal or external impact, noise, or the like). In interpreting a numerical value, the value is interpreted as including an error range unless explicitly stated otherwise.

When a positional relationship between two elements (e.g., layers, films, components, sections, members, parts, regions, areas, portions, and/or the like) are described using any of the terms such as "on," "on a top of," "upon," "on top of," "over," "under," "above," "upper," "at an upper portion," "at a upper side," "below," "lower," "at a lower portion," "at a lower side," "beneath," "near," "close to," "adjacent to," "beside," "next to," "at or on a side of," and/or the like indicating a position or location, one or more other elements may be located between the two elements unless a more limiting term, such as "immediate(ly)," "direct(ly)," or "close(ly)," is used. For example, when an element and another element are described using any of the foregoing terms, this description should be construed as including a case in which the elements contact each other directly as well as a case in which one or more additional elements are disposed or interposed therebetween. Furthermore, the spatially relative terms such as the foregoing terms as well as other terms such as "front," "rear," "back," "left," "right," "top," "bottom," "upper," "lower," "downward," "upward," "up," "down," "column," "row," "vertical," "horizontal," "diagonal," and the like refer to an arbitrary frame of reference. For example, these terms may be used for an example understanding of a relative relationship between elements, including any correlation as shown in the drawings. However, embodiments of the disclosure are not limited thereby or thereto. The spatially relative terms are to be understood as terms including different orientations of the elements in use or in operation in addition to the orientation depicted in the drawings or described herein. For example, where a lower element or an element positioned under another element is overturned, then the element may be termed as an upper element or an element positioned above another element. Thus, for example, the term "under" or "beneath" may encompass, in meaning, the term "above" or "over." An example term "below" or the like, can include all directions, including directions of "below," "above" and diagonal directions. Likewise, an example term "above," "on" or the like can include all directions, including directions of "above," "on," "below" and diagonal directions.

In describing a temporal relationship, when the temporal order is described as, for example, "after," "following," "subsequent," "next," "before," "preceding," "prior to," or the like, a case that is not consecutive or not sequential may be included and thus one or more other events may occur therebetween, unless a more limiting term, such as "just," "immediate(ly)," or "direct(ly)," is used.

It is understood that, although the terms "first," "second," and the like may be used herein to describe various elements (e.g., layers, films, components, sections, members, parts, regions, areas, portions, steps, operations, and/or the like), these elements should not be limited by these terms, for example, to any particular order, precedence, or number of elements. These terms are used only to distinguish one element from another. For example, a first element may denote a second element, and, similarly, a second element may denote a first element, without departing from the scope of the present disclosure. Furthermore, the first element, the second element, and the like may be arbitrarily named according to the convenience of those skilled in the art without departing from the scope of the present disclosure. For clarity, the functions or structures of these elements (e.g., the first element, the second element, and the like) are not limited by ordinal numbers or the names in front of the elements. Further, a first element may include one or more first elements. Similarly, a second element or the like may include one or more second elements or the like.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

The expression that an element (e.g., layer, film, component, section, member, part, region, area, portion, or the like) "is engaged" with another element may be understood, for example, as that the element may be either directly or indirectly engaged with the another element. The term "is engaged" or similar expressions may refer to a term such as "is in contact," "overlaps," "crosses," "intersects," "is connected," "is coupled," "is attached," "is adhered," "is combined," "is linked," "is provided," "is disposed," "interacts," or the like. The engagement may involve one or more intervening elements disposed or interposed between them, unless otherwise specified. The element may be included in at least one of two or more elements that are engaged with each other. Similarly, the another element may be included in at least one of two or more elements that are engaged with each other. When the element is engaged with the another element, at least a portion of the element may be engaged with at least a portion of the another element. The term "with another element" or similar expressions may be understood as "another element," or "with, to, in, or on another element," as appropriate by the context. Similarly, the term "with each other" may be understood as "each other," or "with, to, or on each other," as appropriate by the context.

The phrase "through" may be understood, for example, to be at least partially through or entirely through.

The terms such as a "line" or "direction" should not be interpreted only based on a geometrical relationship in which the respective lines or directions are parallel, perpendicular, diagonal, or slanted with respect to each other, and may be meant as lines or directions having wider directivities within the range within which the components of the present disclosure may operate functionally.

The term "at least one" should be understood as including any and all combinations of one or more of the associated listed items. For example, each of the phrases "at least one of a first item, a second item, or a third item" and "at least one of a first item, a second item, and a third item" may represent (i) a combination of items provided by two or more of the first item, the second item, and the third item or (ii) only one of the first item, the second item, or the third item. Further, "at least some," "some," "some elements," "a portion," "portions," "at least a portion," "at least portions," "a part," "at least a part," "parts," "at least parts," "one or more," or the like of the plurality of elements can represent (i) one element of the plurality of elements, (ii) a part of the plurality of elements, (iii) parts of the plurality of elements, (iv) multiple elements of the plurality of elements, or (v) all of the plurality of elements. Moreover, at least a portion (or a part) of an element can represent (i) a portion (or a part) of the element, (ii) one or more portions (or parts) of the element, or (iii) the element, or all parts of the element.

The expression of a first element, a second elements "and/or" a third element should be understood as one of the first, second and third elements or as any or all combinations of the first, second and third elements. By way of example, A, B and/or C may refer to only A; only B; only C; any of A, B, and C (e.g., A, B, or C); some combination of A, B, and C (e.g., A and B; A and C; or B and C); or all of A, B, and C. Furthermore, an expression "A/B" may be understood as A and/or B. For example, an expression "A/B" may refer to only A; only B; A or B; or A and B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two. Furthermore, when an element (e.g., layer, film, component, section, member, part, region, area, portion, or the like) is referred to as being "between" at least two elements, the element may be the only element between the at least two elements, or one or more intervening elements may also be present.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise.

The term "or" means "inclusive or" rather than "exclusive or." That is, unless otherwise stated or clear from the context, the expression that "x uses a or b" means any one of natural inclusive permutations. For example, "a or b" may mean "a," "b," or "a and b." For example, "a, b or c" may mean "a," "b," "c," "a and b," "b and c," "a and c," or "a, b and c."

Features of various embodiments of the present disclosure may be partially or entirely coupled to or combined with each other, may be technically associated with each other, and may be variously operated, linked or driven together in various ways. Embodiments of the present disclosure may be implemented or carried out independently of each other or may be implemented or carried out together in a co-dependent or related relationship. In one or more aspects, the components of each apparatus and device according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

The terms used herein have been selected as being general in the related technical field; however, there may be other terms depending on the development and/or change of technology, convention, preference of technicians, and so on. Therefore, the terms used herein should not be understood as limiting technical ideas, but should be understood as examples of the terms for describing example embodiments.

Further, in a specific case, a term may be arbitrarily selected by an applicant, and in this case, the detailed meaning thereof is described herein. Therefore, the terms used herein should be understood based on not only the name of the terms, but also the meaning of the terms and the content hereof.

In the following description, various example embodiments of the present disclosure are described in more detail with reference to the accompanying drawings. With respect to reference numerals to elements of each of the drawings, the same elements may be illustrated in other drawings, and like reference numerals may refer to like elements unless stated otherwise. The same or similar elements may be denoted by the same reference numerals even though they are depicted in different drawings. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

In addition, a pixel circuit of a display device which will be described below may include a plurality of transistors. Transistors may be implemented as oxide thin film transistors (TFTs) containing an oxide semiconductor, low temperature polysilicon (LTPS) TFTs containing LTPS, and the like. Each transistor may be implemented as a p-channel TFT or an n-channel TFT.

A transistor is a three-electrode device including a gate, a source, and a drain. The source is an electrode that supplies carriers to the transistor. Within the transistor, carriers flow from the source. The drain is the electrode through which carriers exit the transistor. In a transistor, carriers flow from the source to the drain. In the case of an n-channel transistor, carriers are electrons, and thus the source voltage is lower than the drain voltage such that electrons can flow from the source to the drain. In an n-channel transistor, current flows from the drain to the source. In the case of a p-channel transistor (PMOS), carriers are holes, and thus the source voltage is higher than the drain voltage such that holes can flow from the source to the drain. In a p-channel transistor, current flows from the source to the drain because holes flow from the source to the drain. It should be noted that the source and the drain of a transistor are not fixed. For example, the source and the drain may change depending on the applied voltage. Therefore, the present disclosure is not limited by the source and the drain of a transistor. In the following description, the source and the drain of a transistor will be referred to as first and second electrodes.

A gate signal swings between a gate-on voltage and a gate-off voltage. The gate-on voltage is set to a voltage higher than a threshold voltage of the transistor, and the gate-off voltage is set to a voltage lower than the threshold voltage of the transistor. A transistor is turned on in response to the gate-on voltage and turned off in response to the gate-off voltage. For an n-channel transistor, the gate-on voltage may be a gate high voltage VGH, and the gate-off voltage may be a gate low voltage VGL. For a p-channel transistor, the gate-on voltage may be the gate low voltage VGL, and the gate-off voltage may be the gate high voltage VGH.

Figure 2:
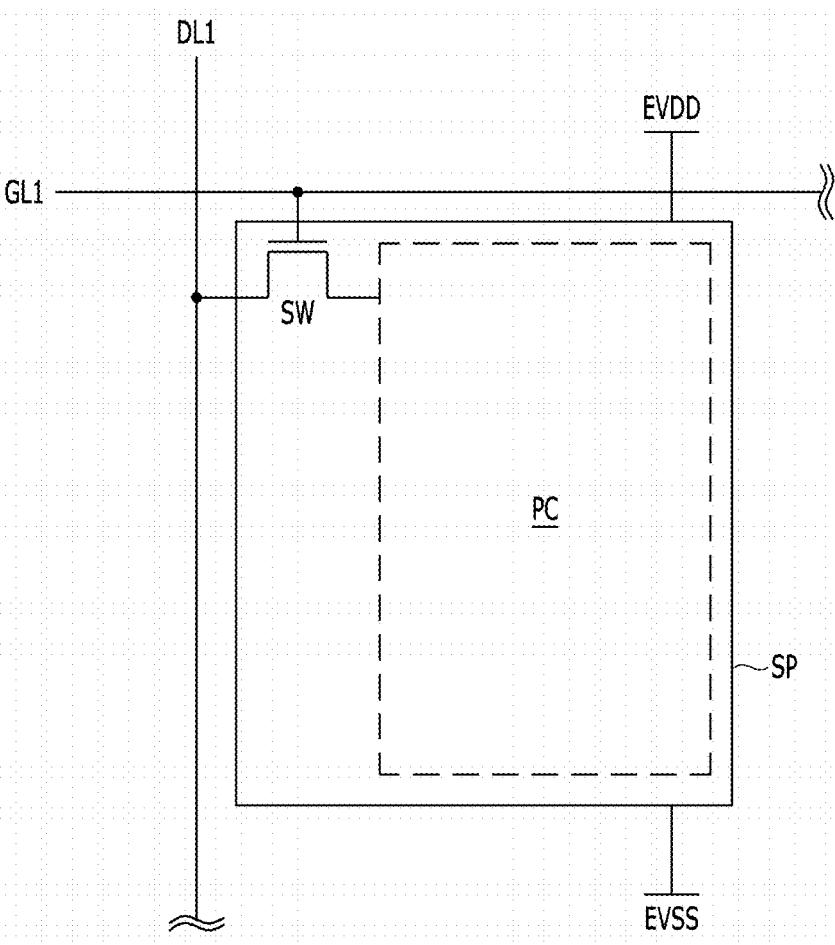
FIG. 2 is a schematic configuration diagram of a subpixel included in the display device according to an aspect of the present disclosure.

FIG. 1 is a schematic configuration diagram of a display device according to an aspect of the present disclosure, and FIG. 2 is a schematic configuration diagram of a subpixel included in the display device according to an aspect of the present disclosure.

Referring to FIGS. 1 and 2, the display device 100 may include a display panel PN including a plurality of subpixels SP, a gate driver GD that supplies various signals to the display panel PN, data driver DD, a timing controller TC that controls the gate driver GD and the data driver DD, and a power supply PU.

The display panel PN is configured to display images to a user and includes the plurality of subpixels SP. In the display panel PN, a plurality of gate lines GL and a plurality of data lines DL intersect each other, and the plurality of subpixels SP is connected to the gate lines SL and the data lines DL. In addition, the plurality of subpixels SP may be connected to power lines such as a high-voltage line, a low-voltage line, and a reference line.

As shown in FIG. 2, one subpixel SP may be connected to a first data line DL1, a first gate line GL1, a first high-voltage power line, and a first low-voltage power line. The first data line DL1 is a line through which a data voltage is transmitted, the first gate line GL1 is a line through which a gate signal is transmitted, the first high-voltage power line is a line through which first high-voltage power VDD is transmitted, and the first low-voltage power line is a line through which first low-voltage power VSS is transmitted. One subpixel SP may include a switching transistor SW that transmits a data voltage input through a data line DL in response to a gate signal input through a gate line GL and a pixel circuit PC that emits light in response to the data voltage. The pixel circuit PC may include a driving transistor that generates a driving current and an organic light emitting diode OLED that emits light in response to the driving current. An array of subpixels SP disposed on the same gate line GL is called one horizontal line HL. The subpixels SP of the same horizontal line HL are turned on by the same gate signal to receive a data voltage input through the data line DL connected to each subpixel SP.

The gate driver GD supplies a plurality of gate signals GS to the plurality of gate lines GL according to a plurality of gate control signals GCS provided from the timing controller TC. Although the gate driver GD is spaced apart from one side of the display panel PN and disposed as one block in FIG. 1, the number and arrangement of gate drivers GD are not limited thereto. The gate driver GD may be provided on a substrate along with a thin film transistor array that constitutes the pixel array of the display panel PN and formed in a gate-in-panel (GIP) structure in a non-display area on both sides or one side of the display panel PN.

The data driver DD converts image data RGB input from the timing controller TC into a data voltage Vdata using a reference gamma voltage according to a plurality of data control signals DCS provided from the timing controller TC. The data driver DD may supply the converted data voltage Vdata to the plurality of data lines DL.

The timing controller TC aligns image data RGB input from the outside and supplies the image data RGB to the data driver DD. The timing controller TC may generate the gate control signal GCS and the data control signal DCS using synchronization signals input from the outside, such as a dot clock signal, a data enable signal, and horizontal/vertical synchronization signals.

The timing controller TC may control the gate driver GD and the data driver DD by supplying the generated gate control signal GCS and data control signal DCS to the gate driver GD and the data driver DD.

The power supply PU may convert power VIN supplied from the outside into the first high-voltage power and the first low-voltage power under the control of the timing controller TC and output the first high-voltage power VDD and the first low-voltage power VSS through the first high-voltage power line and the first low-voltage power line. The power supply PU may generate and output gate voltages including a gate high-voltage power VGH and a gate low-voltage power VGL (also referred as a second low-voltage power hereinafter) required to drive the gate driver GD or voltages required to drive the data driver DD in addition to the first high-voltage power and the first low-voltage power.

Additionally, the power supply PU may generate a discharge signal for performing a power off sequence in which pixels are discharged by applying the voltage of the gate driving circuit after a data voltage is off. The power supply PU of the display device according to an aspect of the present disclosure may generate a first discharge signal DVGH1, a second discharge signal DVGH2, and a third discharge signal DVGH3 at a high voltage and supply the same with time differences to perform the power off sequence.

Figure 3:
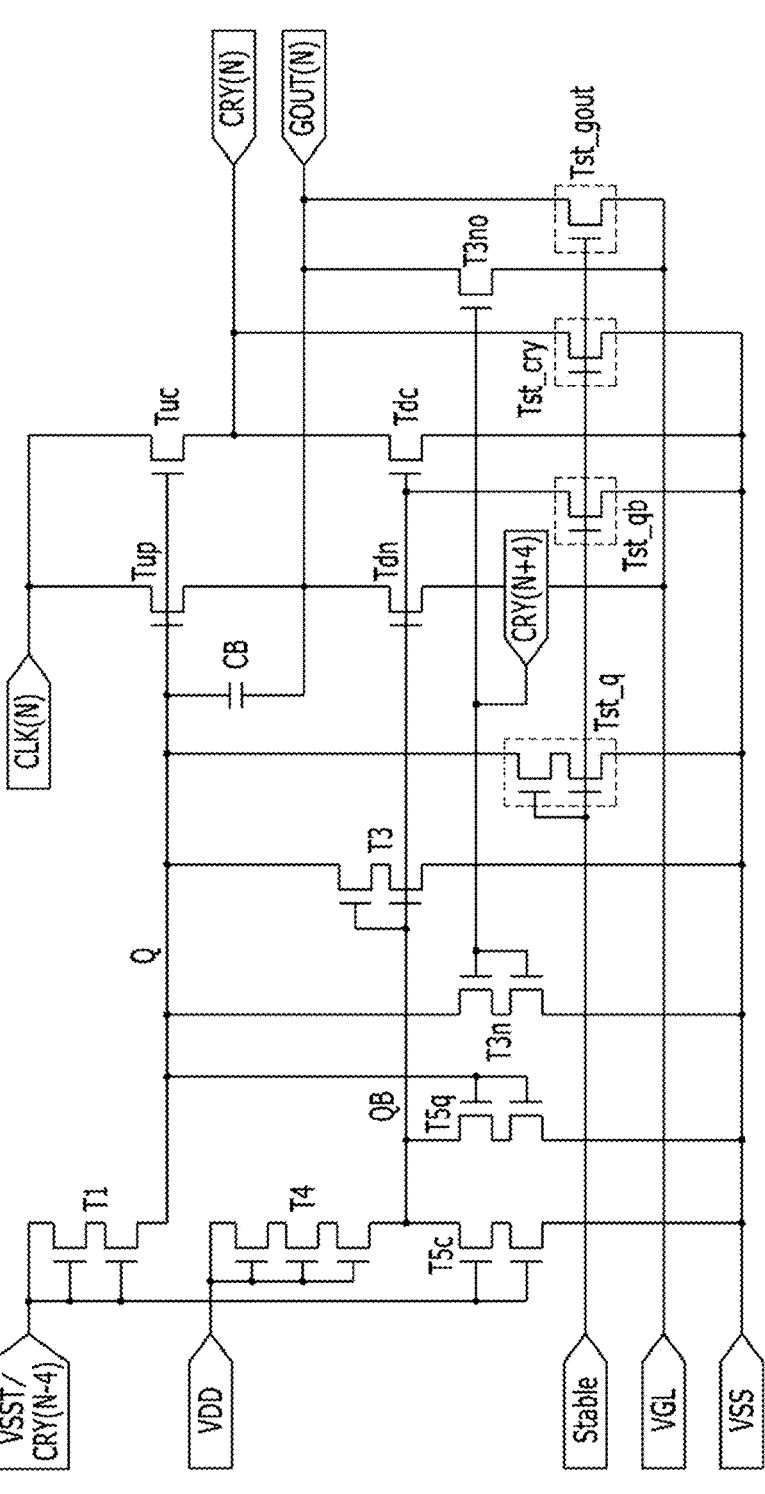
FIG. 3 is a diagram showing a circuit configuration of an N-th stage in a gate driving circuit included in a display device according to a comparative example, where N is a positive integer.
Figure 4:
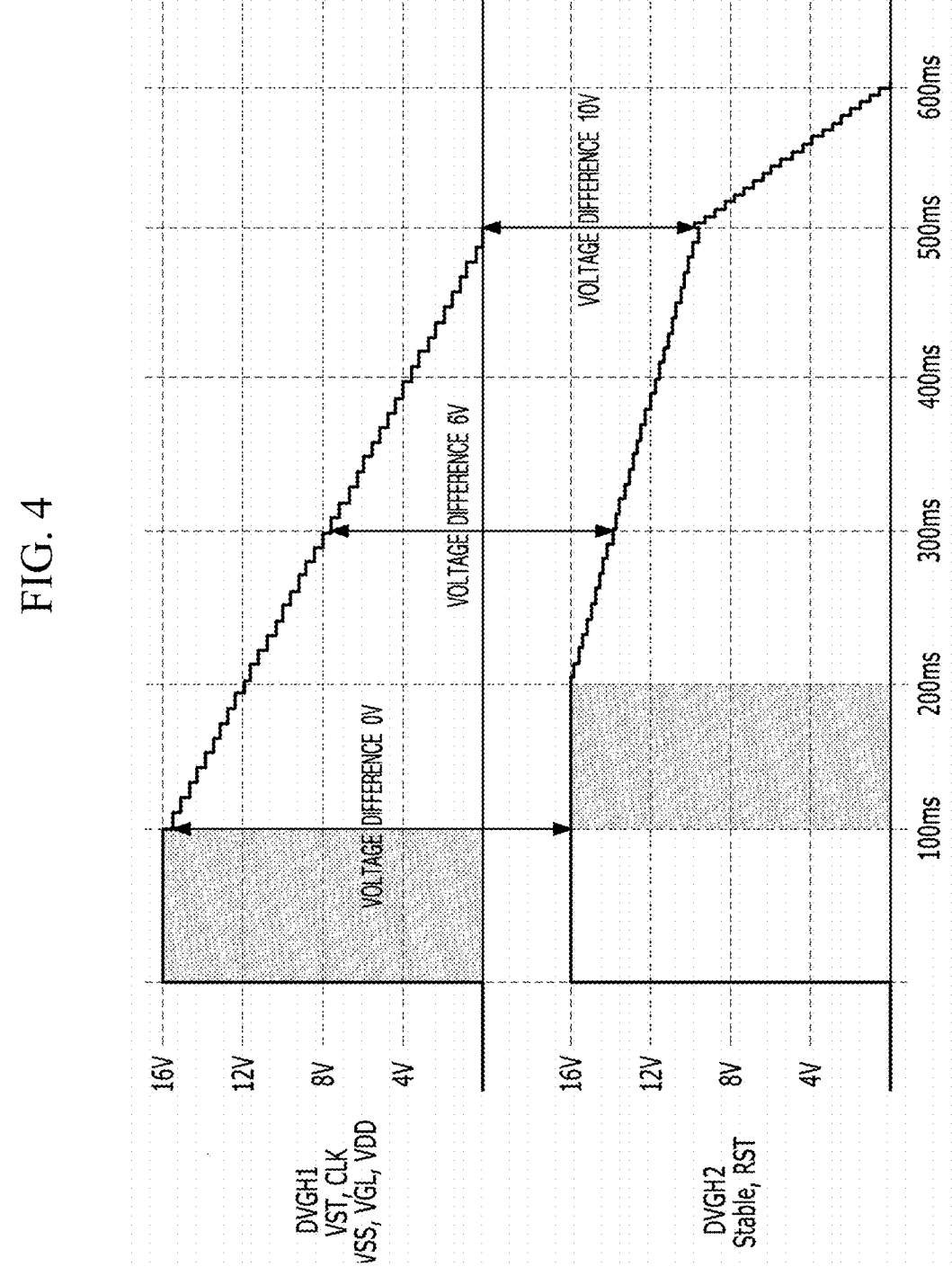
FIG. 4 shows driving waveforms during a power off sequence operation of the display device according to the comparative example.
Figure 5:
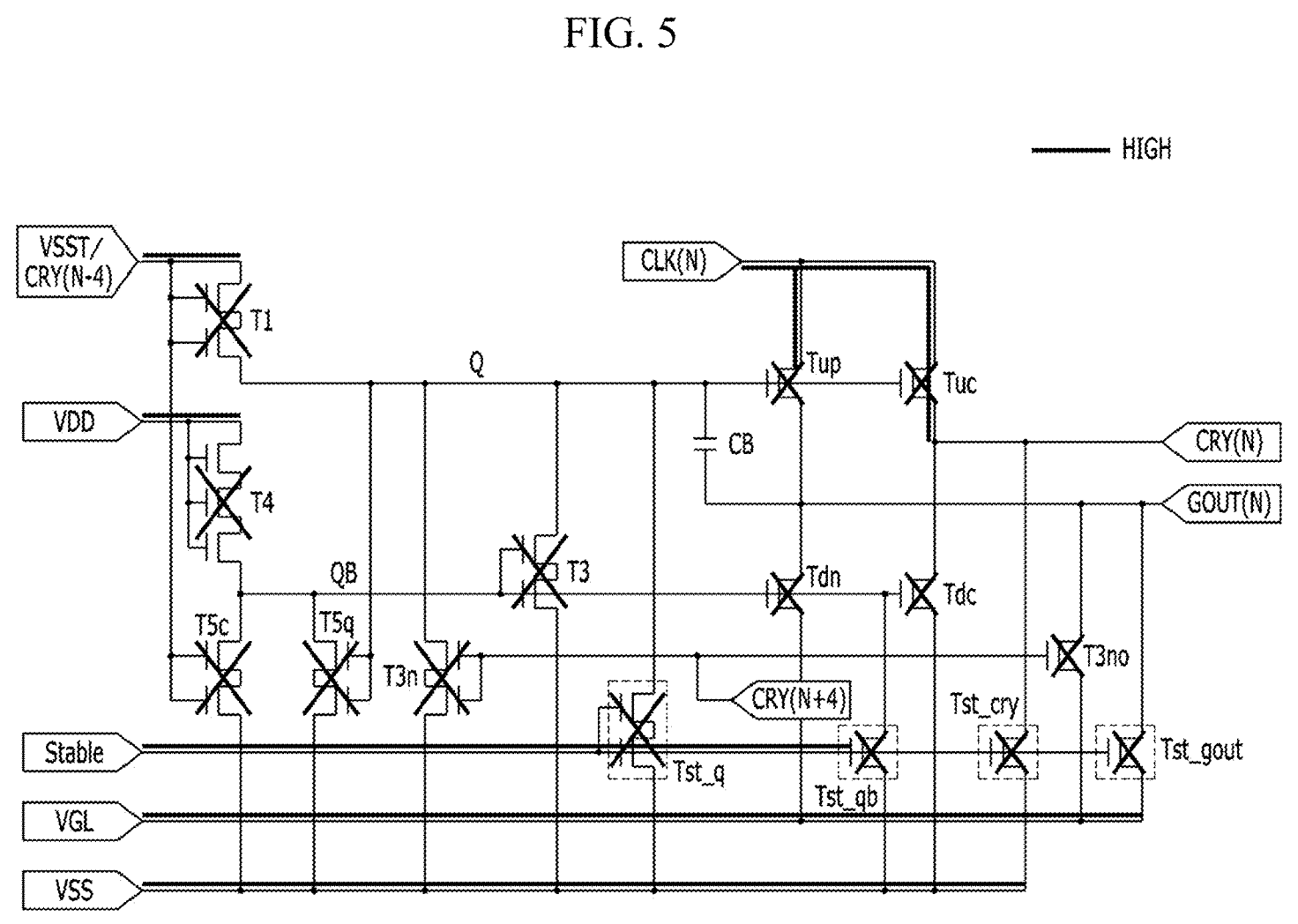
Figure 6:
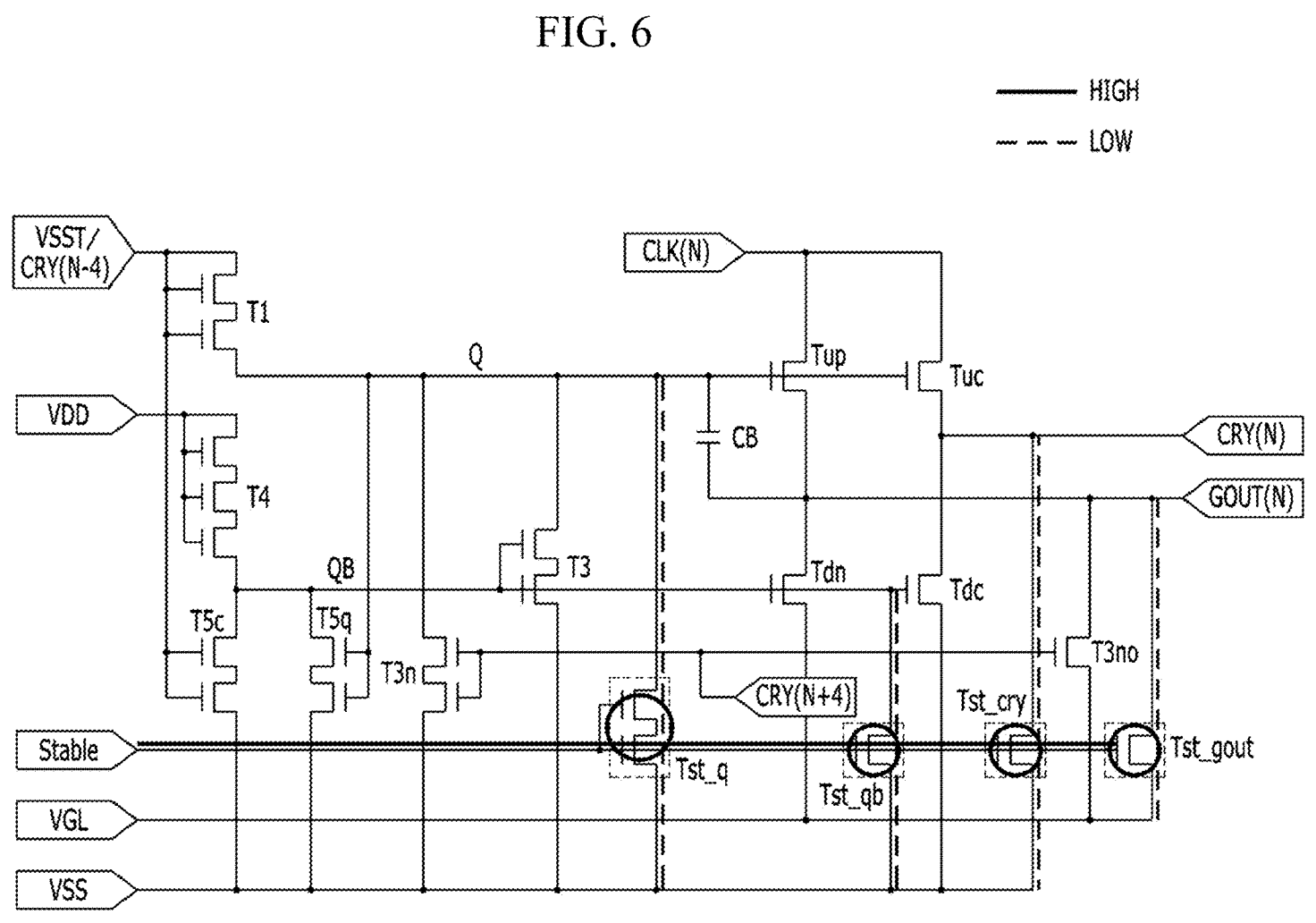

FIGS. 3 to 6 are diagrams for describing a circuit configuration and an operation method of an N-th stage in a gate driving circuit included in a display device according to a comparative example. FIG. 3 is a diagram showing the circuit configuration of the N-th stage in the gate driving circuit included in the display device according to the comparative example. FIG. 4 shows driving waveforms during a power off sequence operation of the display device according to the comparative example, and FIGS. 5 and 6 are diagrams for describing the power off sequence operation according to the driving waveforms of FIG. 4.

FIG. 3 is a diagram showing the circuit configuration of the N-th stage of the gate driver GD included in the display device according to the comparative example.

Referring to FIG. 3, the gate driver GD according to the comparative example includes a plurality of stages that sequentially outputs gate signals, and the N-th stage may output an N-th gate signal GOUT (N) to an N-th gate line GL and output an N-th carry signal CRY(N) to the subsequent stage. The stages of the gate driver GD have the same TFT configuration.

The stage may include a Q node charging unit T1, a Q node discharging unit including T3 and T3$n$, a QB node charging unit T4, a QB node discharging unit including T5$c$ and T5$q$, an output unit including Tup, Tdn, Tuc, and Tdc, and an output stabilization unit including Tst_q, Tst_qb, Tst_cry, and Tst_gout.

The Q node charging unit T1, the Q node discharging unit including T3 and T3$n$, the QB node charging unit T4, and the QB node discharging unit including T5$c$ and T5$q$ may be defined as a controller that controls a Q node and a QB node of the output unit including Tup, Tdn, Tuc, and Tdc. The Q node may be defined as a first control node, and the QB node may be defined as a second control node.

The output unit including Tup, Tdn, Tuc, and Tdc includes a pull-up transistor Tup that is pulled up according to control of the Q node and outputs a clock signal CLK (N) as a gate signal GOUT (N) through an output terminal, a pull-up carry transistor Tuc that outputs a carry signal CRY(N), a pull-down transistor Tdn that is pulled down according to control of the QB node, which is opposite to the Q node, and provides a gate low voltage VGL to an output terminal, and a pull-down carry transistor Tdc that outputs a carry signal CRY(N).

The pull-up transistor Tup may have a gate electrode connected to the Q node, a source electrode connected to the output terminal, and a drain electrode connected to a clock terminal. For example, the pull-up transistor Tup may be turned on during an on period of the Q node and output the clock signal CLK (N) as a gate signal GOUT (N). A capacitor CB connected between the gate electrode (Q node) and the source electrode (output terminal) of the pull-up transistor Tup may reduce a rising time of the gate signal GOUT (N) by bootstrapping and amplifying a high voltage of the Q node when the pull-up transistor Tup is pulled up to output a gate-on voltage of the clock signal CLK (N).

The pull-up carry transistor Tuc may have a gate electrode connected to the Q node, a source electrode connected to a carry output terminal, and a drain electrode connected to the clock terminal. For example, the pull-up carry transistor Tuc may be turned on during the on period of the Q node and output the clock signal CLK (N) as a carry signal CRY(N).

The pull-down transistor Tdn may have a gate electrode connected to the QB node, a source electrode connected to a line through which the second low-voltage power VGL is supplied, and a drain electrode connected to the output terminal. The pull-down transistor Tdn may be turned on during an on period of the QB node corresponding to an off period of the Q node to discharge the output terminal to the second low-voltage power VGL.

The pull-down carry transistor Tdc may have a gate electrode connected to the QB node, a source electrode connected to a line through which the first low-voltage power VSS is supplied, and a drain electrode connected to the carry output terminal. The pull-down carry transistor Tdc may be turned on during the on period of the QB node corresponding to the off period of the Q node to discharge the carry output terminal to the first low-voltage power VSS.

The Q node charging unit T1 may charge the Q node by receiving a start signal VST applied to a start terminal or a carry signal CRY(N−4) of the previous stage. The Q node charging unit T1 may include at least one Q charging transistor T1 having a gate electrode and a drain electrode connected to the start terminal and a source electrode connected to the Q node. The Q charging transistor T1 may be turned on when the start signal VST or the carry signal CRY(N−4) of the (N−4)-th previous stage is a high voltage to precharge the Q node with the high voltage.

The Q node discharging unit T3 and T3$n$ may respond to control of the QB node and respond to a reset signal RST or a carry signal CRY(N+4) of the (N+4)-th subsequent stage to discharge the Q node to the first low-voltage power VSS. The Q node discharging unit T3 and T3$n$ may include a first Q discharge transistor T3 having a gate electrode connected to the QB node, a source electrode connected to the line through which the first low-voltage power VSS is supplied, and a drain electrode connected to the Q node, a second Q discharge transistor having a gate electrode connected to the reset terminal to which the reset signal RST or the carry signal CRY(N+4) of the subsequent stage is supplied, a source electrode connected to the line through which first low-voltage power VSS is supplied, and a drain electrode connected to the Q node, and a third Q discharge transistor T3no having a gate electrode connected to the reset terminal to which the reset signal RST or the carry signal CRY(N+4) of the subsequent stage is supplied, a source electrode connected to the line through which the second low-voltage power VGL is supplied, and a drain electrode connected to the output terminal of the Q node.

The first Q discharge transistor T3 may be turned on during the off period of the Q node, that is, the on period of the QB node, to discharge the Q node to the first low-voltage power VSS.

The second Q discharge transistor T3n may be turned on when the reset signal RST or the carry signal CRY(N+4) of the subsequent stage is a high voltage to discharge the Q node to the first low-voltage power VSS.

The third Q discharge transistor T3no may be turned on when the reset signal RST or the carry signal CRY(N+4) of the subsequent stage is a high voltage to discharge the output terminal of the Q node to the second low-voltage power VGL.

The QB node charging unit T4 may charge the QB node with a first high voltage VDD in response to the first high voltage VDD applied to the power terminal. The QB node charging unit T4 may include at least one QB charging transistor T4 having a gate electrode and a drain electrode connected to the power terminal and a source electrode connected to the QB node.

The QB node discharging unit T5c and T5q may respond to control of the start terminal and respond to control of the Q node to discharge the QB node to the first low-voltage power VSS. The QB node discharging unit may include a first QB discharge transistor T5q having a gate electrode connected to the Q node, a source electrode connected to the line through which the first low-voltage power VSS is supplied, and a drain electrode connected to the QB node, and a second QB discharge transistor T5c having a gate electrode connected to the start terminal, a source electrode connected to the line through which the first low-voltage power VSS is supplied, and a drain electrode connected to the QB node.

The first QB discharge transistor T5q may be turned on during the on period of the Q node to discharge the QB node to the first low-voltage power VSS. The second QB discharge transistor T5c is turned on during precharging during the on period of the Q node in response to the start signal VST or the carry signal CRY(N−4) of the previous stage to discharge the QB node to the first low-voltage power VSS.

The output stabilization unit Tst_q, Tst_qb, Tst_cry, and Tst_gout may discharge the Q node, the QB node, a carry signal output terminal, and a gate signal output terminal in response to a stable signal Stable or a reset signal RST. Here, the stable signal refers to a reset signal for resetting current or voltage components remaining in the Q node and the QB node after the operation for one cycle ends in a scan line. That is, the stable signal is stable in the sense that it allows the scan operation of the next cycle to be performed stably by removing residual power after performing a scan operation for one cycle in the n-th stage.

The output stabilization unit Tst_q, Tst_qb, Tst_cry, and Tst_gout may include a Q stabilization transistor Tst_q that discharges the Q node to the first low-voltage power VSS, a QB stabilization transistor Tst_qb that discharges the QB node to the first low-voltage power VSS, a carry output stabilization transistor Tst_cry that discharges the carry signal output terminal to the first low-voltage power VSS, and a gate output stabilization transistor Tst_gout that discharges the gate signal output terminal to the second low-voltage power VGL. The output stabilization unit Tst_q, Tst_qb, Tst_cry, and Tst_gout may operate by the stable signal Stable to reset the Q node, the QB node, the carry signal output terminal, and the gate signal output terminal.

In the display device having the above configuration according to the comparative example, a power off sequence in which pixels are discharged by operating the voltage of the gate driving circuit may be performed after the data voltage is off.

The display device according to the comparative example performs a power off sequence by generating two discharge signals at a high voltage, for example, the first discharge signal DVGH1 and the second discharge signal DVGH2 and supplying the same with a time difference. The first discharge signal DVGH1 is applied to the lines through which VST, CLK, VSS, and VGL are supplied, and the second discharge signal DVGH2 is applied to the lines through which Stable and RST are supplied. The display device according to the comparative example performs a power off sequence by applying the first discharge signal DVGH1 and applying the second discharge signal DVGH2 after a predetermined time delay.

FIGS. 4 to 6 are diagrams for describing a power off sequence operation performed in the display device having the stage circuit of FIG. 3 according to the comparative example. FIG. 4 shows driving waveforms during a power off sequence operation of the display device according to the comparative example, and FIGS. 5 and 6 are diagrams for describing the power off sequence operation according to the driving waveforms of FIG. 4.

Referring to FIG. 4, the display device according to the comparative example generates the first discharge signal DVGH1, applies the same to the lines through which VST, CLK, VSS, VGL, and VDD are supplied, generates the second discharge signal DVGH2 after a predetermined time delay, and applies the second discharge signal DVGH2 to the lines through which Stable and RST are supplied. The first discharge signal DVGH1 and the second discharge signal DVGH2 are high-voltage signals and may have a voltage value of 16 V, for example. The first discharge signal DVGH1 and the second discharge signal DVGH2 may be applied sequentially for the same time, for example, 100 ms. For example, after the first discharge signal DVGH1 is applied for 100 ms, the second discharge signal DVGH2 may be applied for 100 ms.

FIG. 5 is a diagram showing a circuit operation when the first discharge signal DVGH1 is applied, and FIG. 6 is a diagram showing a circuit operation when the second discharge signal DVGH2 is applied.

Referring to FIG. 5, the first discharge signal DVGH1 is supplied to all input terminals. That is, the first discharge signal DVGH1 is applied to the lines through which VST, CLK, VSS, VGL, VDD, and Stable are supplied. Accordingly, the lines through which all input signals, that is, VST, CLK, VSS, VGL, and VDD, are supplied are in a high-voltage state. In addition, since all input signals are input at a high voltage, the gate-source voltages of the transistors to which the input signals are applied through the gate electrodes become 0 V, and thus all the transistors are turned off.

Referring to FIG. 6, after the first discharge signal DVGH1 is applied, the second discharge signal DVGH2 is generated and applied to the line through which the stable (reset) signal is supplied. Accordingly, the second discharge signal DVGH2, which is a high-voltage signal, is input to the gate electrodes of the transistors of the output stabilization unit Tst_q, Tst_qb, Tst_cry, and Tst_gout to which the stable or reset signal is input, and thus the transistors of the output stabilization unit Tst_q, Tst_qb, Tst_cry, and Tst_gout may be turned on.

The Q stabilization transistor Tst_q may be turned on to maintain the Q node in a low voltage state. The QB stabilization transistor Tst_qb may be turned on to discharge the QB node from a high voltage state to a low voltage state. The carry output stabilization transistor Tst_cry may be turned on to discharge the carry signal output terminal to a low voltage state. The gate output stabilization transistor Tst_gout may be turned on to discharge the gate signal output terminal to a low voltage state.

Here, the transistors of the output stabilization unit Tst_q, Tst_qb, Tst_cry, and Tst_gout receive the first discharge signal DVGH1 through the source electrodes in the previous stage, and then receive the second discharge signal DVGH2 through the gate electrodes. Accordingly, the transistors have the same gate-source voltage Vgs (100 ms) at the beginning of input of the second discharge signal DVGH2, and as the discharge amount of the first discharge signal DVGH1 input to the source electrodes first increases, differences in the gate-source voltages Vgs also increase, resulting in increase in the discharge rate (200 ms to 500 ms). After the first discharge signal DVGH1 applied to the source electrodes is completely discharged (500 ms to 600 ms), discharging may be completely rapidly.

Compared to the display device having such a configuration according to the comparative example, in the display device according to an aspect of the present disclosure, the Q stabilization transistor Tst_q, the carry output stabilization transistor Tst_cry, and the gate output stabilization transistor Tst_gout among the transistors of the output stabilization unit Tst_q, Tst_qb, Tst_cry, and Tst_gout are deleted, a third discharge signal DVGH3 is added, and a power off sequence in which the voltage of the gate driving circuit is operated to discharge pixels may be performed after a data voltage is off.

Figure 7:
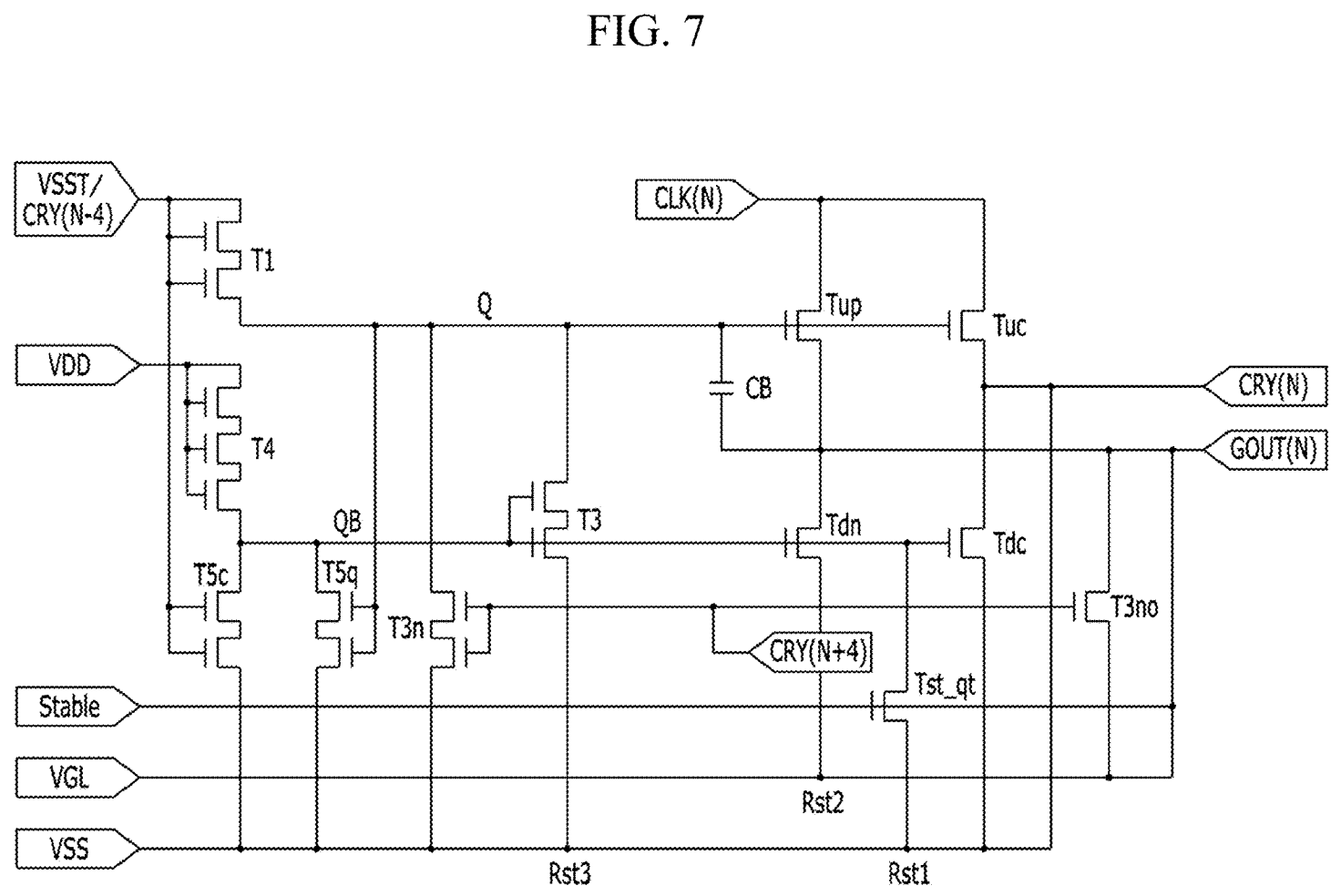
Figure 8:
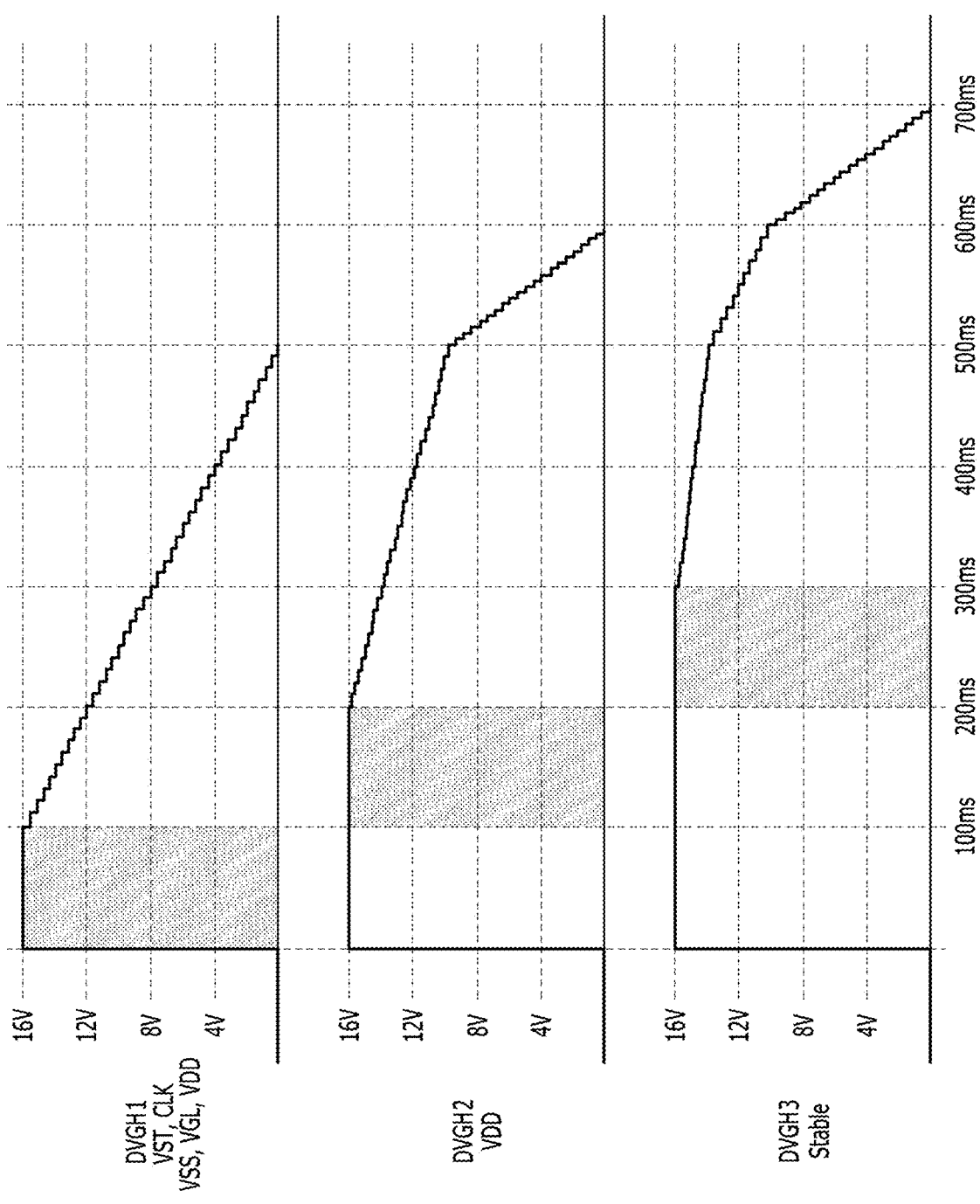
FIG. 8 shows driving waveforms during a power off sequence operation of the display device according to an aspect of the present disclosure.
Figure 9:
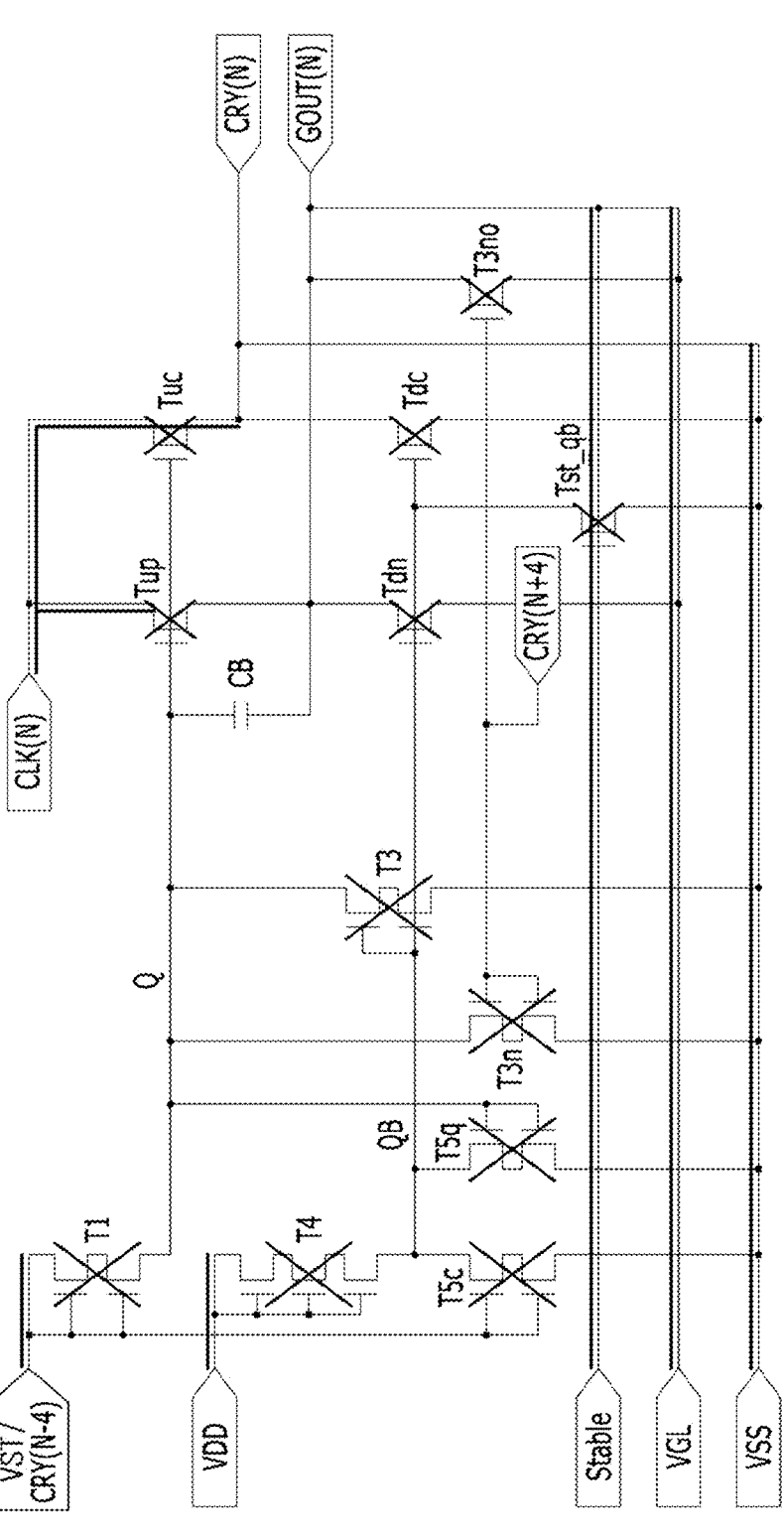
Figure 10:
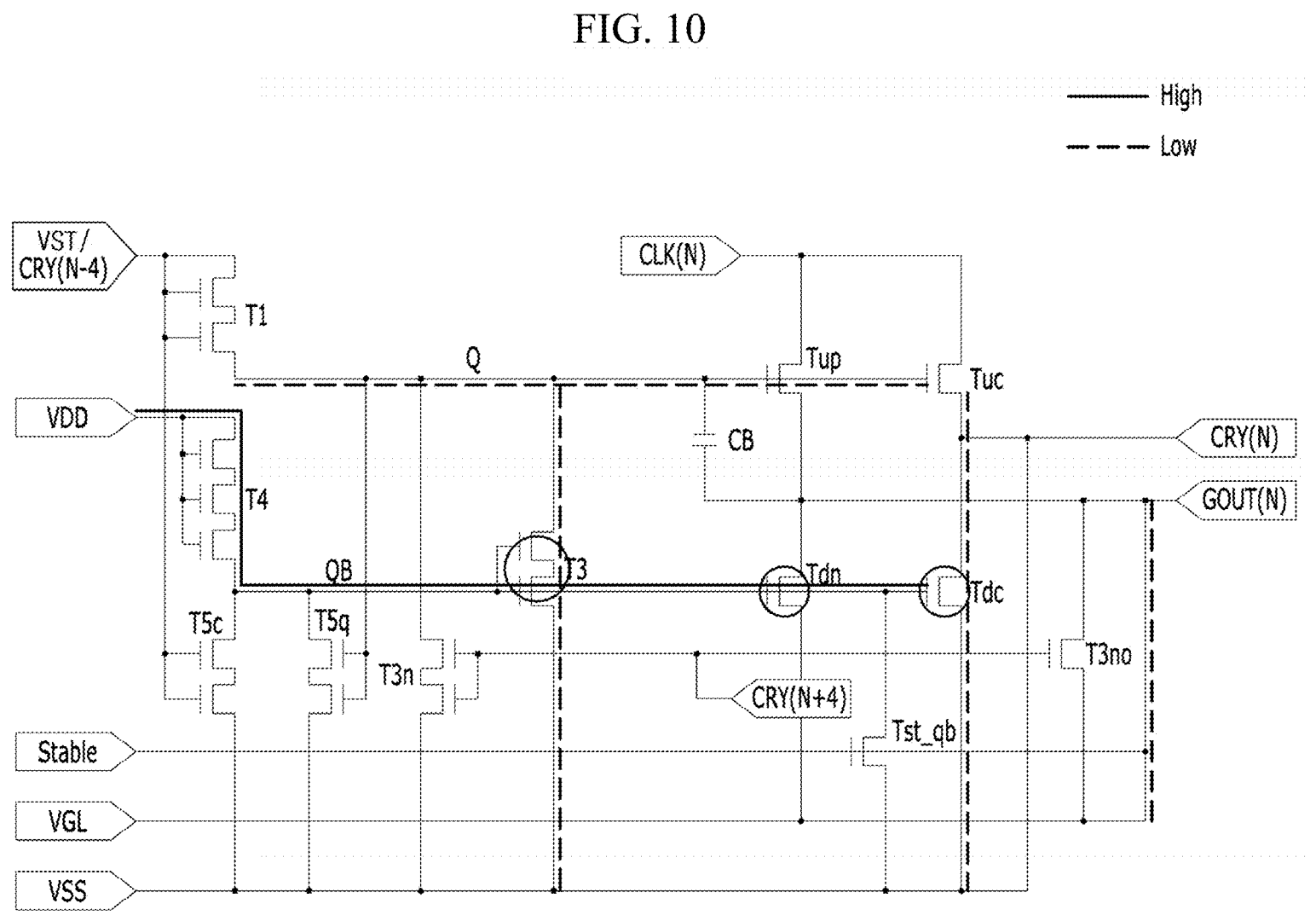
Figure 11:
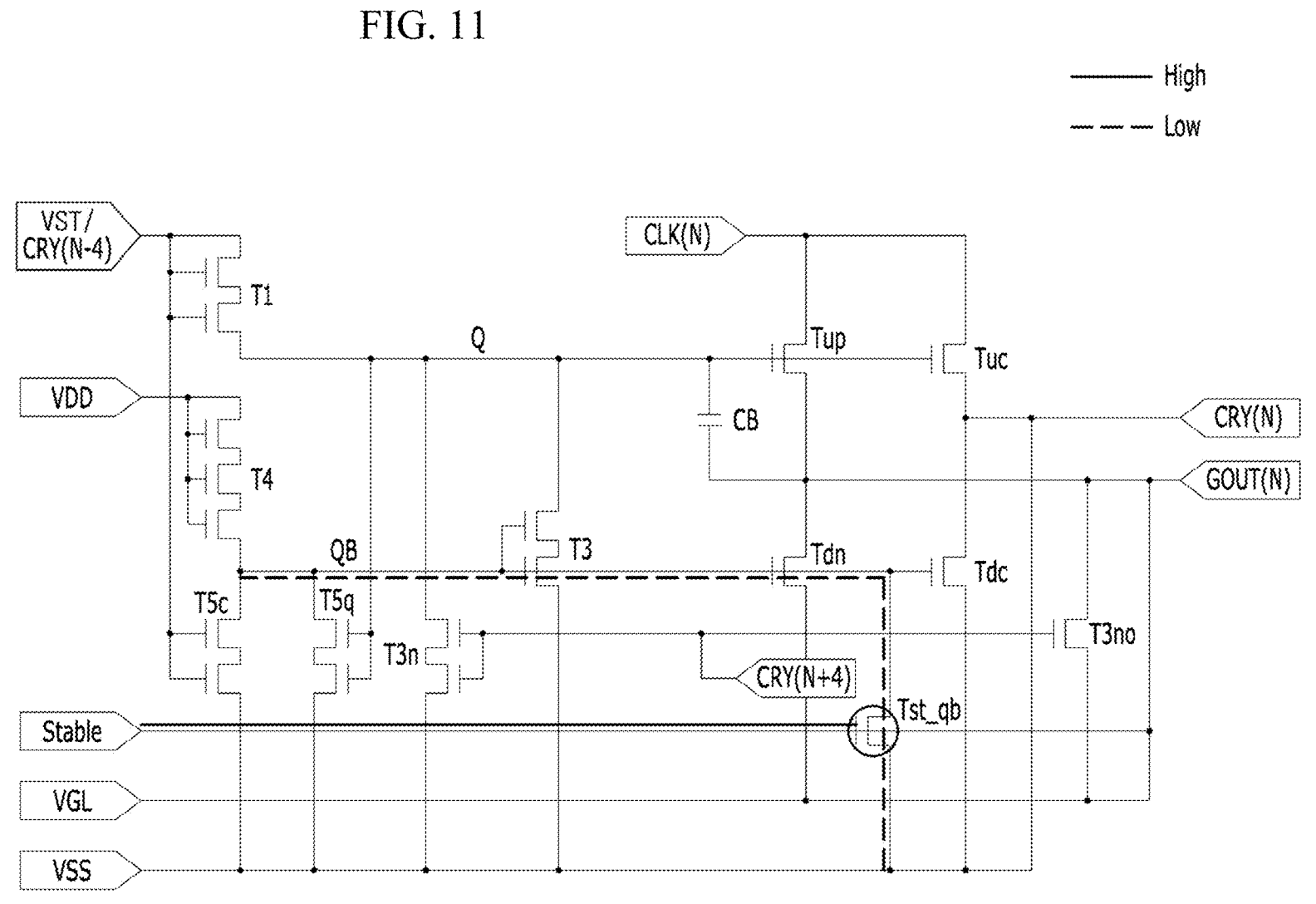

A circuit configuration and operating method of the N-th stage in the gate driving circuit included in the display device according to an aspect of the present disclosure will be described in detail with reference to FIGS. 7 to 11. FIG. 7 is a diagram showing the circuit configuration of the N-th stage in the gate driving circuit included in the display device according to an aspect of the present disclosure. FIG. 8 shows driving waveforms during a power off sequence operation of the display device according to an aspect of the present disclosure and FIGS. 9 to 11 are diagrams for describing the power off sequence operation according to the driving waveforms of FIG. 8.

FIG. 7 is a diagram showing the circuit configuration of the N-th stage of the gate driver GD included in the display device according to an aspect of the present disclosure.

Referring to FIG. 7, the gate driver GD according to an aspect of the present disclosure includes a plurality of stages that sequentially outputs gate signals, and the N-th stage may output an N-th gate signal GOUT (N) to an N-th gate line GL and output an N-th carry signal CRY(N) to the subsequent stage. The stages of the gate driver GD have the same TFT configuration.

The stage may include a Q node charging unit T1, a Q node discharging unit T3 and T3n, a QB node charging unit T4, a QB node discharging unit T5c and T5q, an output unit Tup, Tdn, Tuc, and Tdc, and an output stabilization unit Tst_qb.

The stage of the gate driver GD according to the aspect of the present disclosure differs from the stage according to the comparative example of FIG. 3 in that the output stabilization unit Tst_qb includes only the QB stabilization transistor Tst_qb. In addition, the configurations and functions of the Q node charging unit T1, Q node discharging unit T3 and T3n, QB node charging unit T4, and QB node discharging unit T5c and T5q are the same as those of the stage according to the comparative example in FIG. 3. Accordingly, the aspect of the present disclosure will be described focusing on configurations that are different from the comparative example.

The output stabilization unit Tst_qb may include a QB stabilization transistor Tst_qb that discharges the QB node to the first low-voltage power VSS in response to the stable signal Stable. The QB stabilization transistor Tst_qb has a gate electrode connected to the stable signal input terminal, a drain electrode connected to the QB node, and a source electrode connected to the first low-voltage power VSS. The QB stabilization transistor Tst_qb may be operated by the stable signal Stable to reset the QB node.

The display device having this configuration according to an aspect of the present disclosure may generate three discharge signals at a high voltage, for example, a first discharge signal DVGH1, a second discharge signal DVGH2, and a third discharge signal DVGH3, in order to perform a power off sequence in which pixels are discharged by operating the voltage of the gate driving circuit after a data voltage is off. These discharge signals DVGH1, DVGH2, and DVGH3 may be generated in the power supply PU under the control of the timing controller TC.

FIGS. 8 to 11 are diagrams for describing a power off sequence operation performed in the display device having the stage circuit according to an aspect of the present disclosure shown in FIG. 7. FIG. 8 shows driving waveforms during the power off sequence operation of the display device according to an aspect of the present disclosure, and FIGS. 9 to 11 are diagrams for describing the power off sequence operation according to the driving waveforms of FIG. 8.

Referring to FIG. 8, during the power off sequence operation, the display device according to an aspect of the present disclosure may generates three discharge signals at a high voltage, for example, the first discharge signal DVGH1, the second discharge signal DVGH2, and the third discharge signal DVGH3 and sequentially supply the same.

The first discharge signal DVGH1 may be applied to the lines through which VST, CLK, VSS, VGL, and VDD are supplied, the second discharge signal DVGH2 may be applied to the line through which VDD is supplied, and the third discharge signal DVGH3 may be applied to the line through which the stable or reset signal is supplied.

The first discharge signal DVGH1, the second discharge signal DVGH2, and the third discharge signal DVGH3 are high-voltage signals and may have a voltage value of, for example, 16 V. The first discharge signal DVGH1, the second discharge signal DVGH2, and the third discharge signal DVGH3 may be sequentially applied for the same period of time, for example, 100 ms. The power off sequence operation may be performed over a first period P1 to a seventh period P7. Here, the voltage and application time of the first discharge signal DVGH1, the second discharge signal DVGH2, and the third discharge signal DVGH3 are merely an example and may be set to various values.

FIG. 9 is a diagram illustrating a circuit operation when the first discharge signal DVGH1 is applied in the first period P1, FIG. 10 is a diagram illustrating a circuit operation when the second discharge signal DVGH2 is applied in the second period P2, and FIG. 11 is a diagram illustrating a circuit operation when the third discharge signal DVGH3 is applied in the third period P3.

Referring to FIGS. 8 and 9, in the first period P1, the first discharge signal DVGH1 is supplied to all input terminals. That is, the first discharge signal DVGH1 may be applied to the lines through which VST, CLK, VSS, VGL, VDD, and Stable are supplied. Accordingly, the lines through which VST, CLK, VSS, VGL, VDD, and Stable are supplied are in a high voltage state. In addition, since all input signals are input at a high voltage, the gate-source voltages of the transistors to which the input signals are applied through the gate electrodes becomes 0 V, and thus all the transistors are turned off. After the first period P1, the first discharge signal DVGH1 applied to the lines through which VST, CLK, VSS, VGL, and VDD are supplied may be slowly discharged over the second period P2 to the fifth period P5.

Referring to FIGS. 8 and 10, the second discharge signal DVGH2 may be applied to the VDD supply line in the second period P2. As the second discharge signal DVGH2 is applied to the VDD supply line, the QB node becomes a high voltage state. Accordingly, the first Q discharge transistor T3, the pull-down transistor Tdn, and the pull-down carry transistor Tdc, which are controlled by the QB node voltage, may be turned on.

As the first Q discharge transistor T3 is turned on, the Q node is discharged to a low voltage state. That is, the Q stabilization transistor Tst_q is turned on to convert the Q node to a low voltage state in the comparative example, whereas the same function is performed using the first Q discharge transistor T3 in the aspect of the present disclosure. Therefore, the Q stabilization transistor Tst_q may be deleted.

As the pull-down transistor Tdn is turned on, the gate signal output terminal is discharged to a low voltage state. That is, the gate output stabilization transistor Tst_gout is turned on to discharge the gate signal output terminal in the comparative example, whereas the same function is performed using the pull-down transistor Tdn in the aspect of the present disclosure. Accordingly, the gate output stabilization transistor Tst_gout may be deleted.

As the pull-down carry transistor Tdc is turned on, the carry signal output terminal is discharged to a low voltage state. That is, the carry output stabilization transistor Tst_cry is turned on to discharge the carry signal output terminal in the comparative example, whereas the same function is performed using the pull-down carry transistor Tdc in the aspect of the present disclosure. Accordingly, the carry output stabilization transistor Tst_cry may be deleted.

As described above, by applying the second discharge signal DVGH2 to the VDD supply line in the second period P2 to turn on the first Q discharge transistor T3, the pull-down transistor Tdn, and the pull-down carry transistor Tdc, the Q node, the gate signal output terminal, and the carry signal output terminal can be discharged. Accordingly, the Q stabilization transistor Tst_q, the gate output stabilization transistor Tst_gout, and the carry output stabilization transistor Tst_cry can be deleted.

Here, in the first Q discharge transistor T3, the pull-down transistor Tdn, and the pull-down carry transistor Tdc, the first discharge signal DVGH1 applied to the source electrodes in the first period P1 is discharged. Therefore, when the second discharge signal DVGH2 is input to the gate electrodes in the second period P2, differences in the gate-source voltages Vgs increase as the discharge amount of the first discharge signal DVGH1 in the source electrodes increases. As a result, the discharge rate may increase. In the sixth period P6 after the first discharge signal DVGH1 is completely discharged, the differences in the gate-source voltages Vgs of the first Q discharge transistor T3, the pull-down transistor Tdn, and the pull-down carry transistor Tdc are maximized and thus the second discharge signal DVGH2 may be rapidly discharged.

Referring to FIGS. 8 and 11, the third discharge signal DVGH3 may be applied to the Stable/RST supply line in the third period P3. As the third discharge signal DVGH3 is applied to the Stable supply line, the QB stabilization transistor Tst_qb may be turned on to discharge the QB node from a high voltage state to a low voltage state.

The first discharge signal DVGH1 is input to the source electrode of the QB stabilization transistor Tst_qb in the first period P1 and is being discharged, and the second discharge signal DVGH2 is input to the drain electrode thereof in the second period P2 and is being discharged. Therefore, when the third discharge signal DVGH3 is input to the gate electrode in the third period P3, the gate-source voltage Vgs is the same at the beginning of input of the third discharge signal DVGH3, and then the discharge rate may increase as the discharge amounts of the first discharge signal DVGH1 and the second discharge signal DVGH2 increase. In the sixth period P6 in which the first discharge signal DVGH1 is completely discharged and only the second discharge signal DVGH2 remains, the discharge rate may increase more than in the fourth and fifth periods P4 and P5. The discharge rate may further increase in the seventh period P7 in which both the first discharge signal DVGH1 and the second discharge signal DVGH2 are discharged.

As described above, when the display device according to the aspect of the present disclosure performs a power off sequence operation, the Q node, the gate signal output terminal, the carry signal output terminal can be discharged using the first Q discharge transistor T3, the pull-down transistor Tdn, and the pull-down carry transistor Tdc in the second period P2 in which the second discharge signal DVGH2 is applied to the VDD supply line after the first period P1 in which the first discharge signal DVGH1 is applied to all input terminals. Accordingly, the Q stabilization transistor Tst_q, the gate output stabilization transistor Tst_gout, and the carry output stabilization transistor Tst_cry used in the conventional display device can be deleted. Thereafter, by applying the third discharge signal DVGH3 to the stable/reset signal supply line in the third period P3, the QB stabilization transistor Tst_qb can be turned on to discharge the QB node from a high voltage state to a low voltage state.

Figure 12:
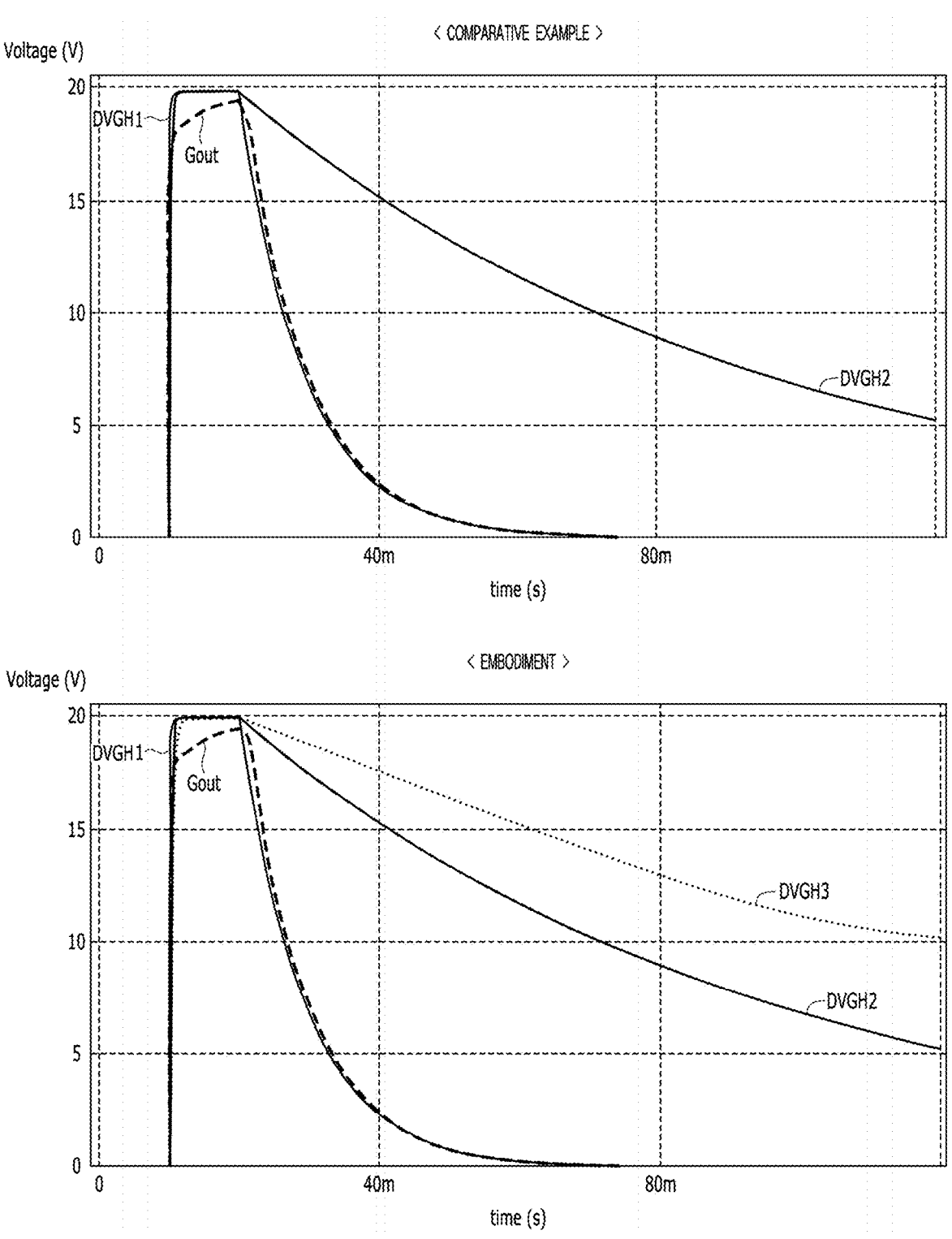
FIG. 12 shows simulation graphs of discharge signals of the display devices according to the comparative example and the aspect.

FIG. 12 shows simulation graphs of discharge signals of the display devices according to the comparative example and the aspect.

As shown in FIG. 12, the display device according to the comparative example outputs the first discharge signal DVGH1 and the second discharge signal DVGH2 during the power off sequence operation of the gate driving circuit. On the other hand, the display device according to the aspect of the present disclosure outputs the first discharge signal DVGH1, the second discharge signal DVGH2, and the third discharge signal DVGH3.

Figure 13:
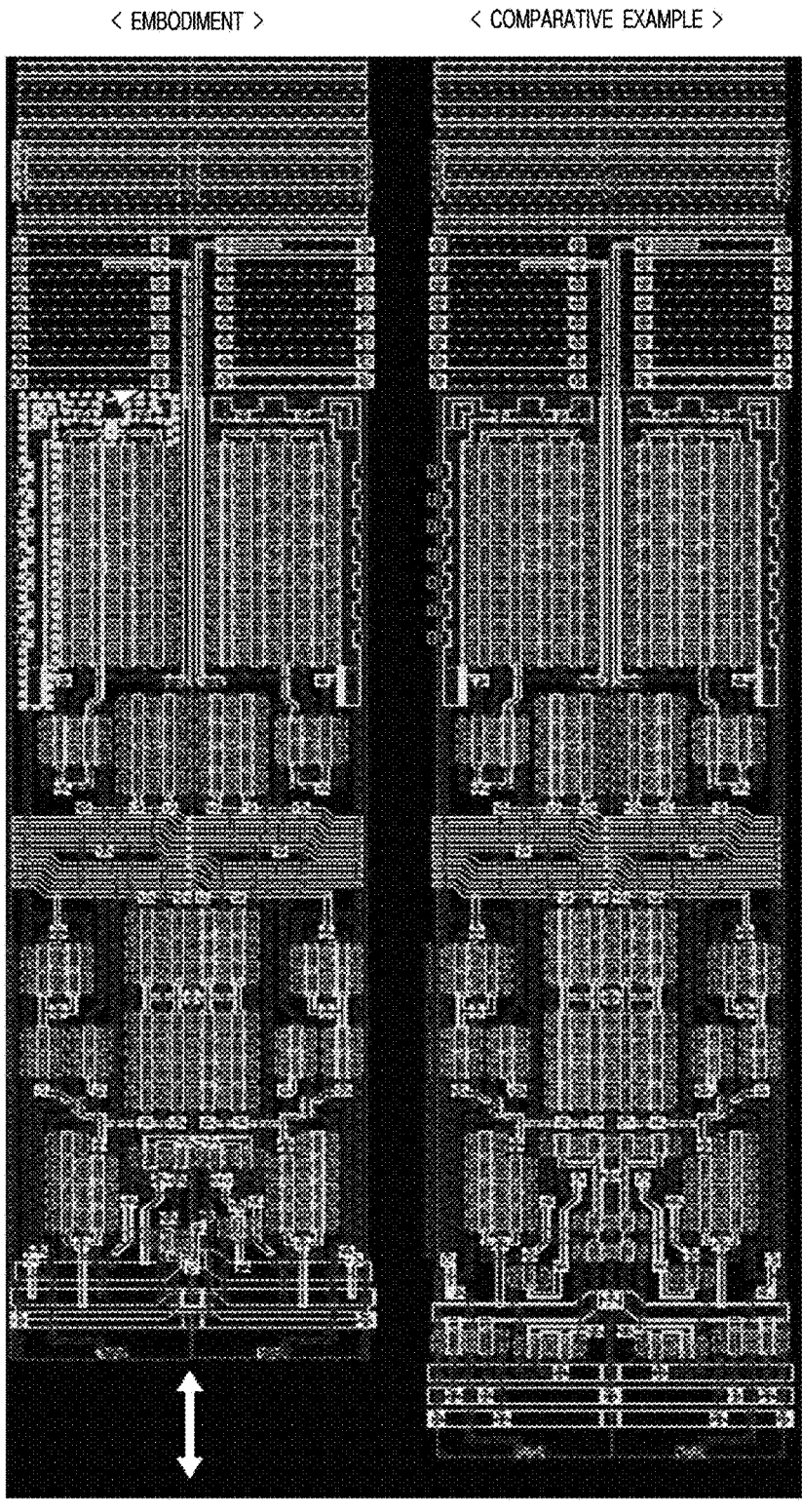
FIG. 13 shows comparison of design areas of the gate driving circuits of the display devices according to the comparative example and the aspect.

FIG. 13 shows comparison of design areas of the gate driving circuits of the display devices according to the comparative example and the aspect.

Since the first discharge signal DVGH1, the second discharge signal DVGH2, and the third discharge signal DVGH3 used in the aspect of the present disclosure may be generated and output from the existing power supply PU, additional configuration is not necessary, and the Q stabilization transistor Tst_q, the gate output stabilization transistor Tst_gout, and the carry output stabilization transistor Tst_cry used in the conventional display device can be deleted. Accordingly, as shown in FIG. 13, the design area of the gate driving circuit can be significantly reduced compared to the comparative example.

Aspects of the present disclosure have the following effects.

According to aspects of the present disclosure, it is possible to provide a display device and a method of driving the same which can reduce a bezel area by simplifying the configuration of a circuit for discharging an output stage and a control stage in a gate driving circuit to decrease a design area.

According to aspects of the present disclosure, it is possible to provide a display device and a method of driving the same which can simplify the configuration of the gate driving circuit to reduce a design area by deleting three transistors for discharging instead of adding one signal line for discharging compared to the existing gate driving circuits, thereby reducing the bezel area.

The effects according to the present disclosure are not limited to the above-described effects, and various other effects are included within the present disclosure.

Although aspects of the present disclosure have been described in more detail with reference to the accompanying drawings, the present disclosure is not necessarily limited to these aspects, and various modifications may be made without departing from the technical spirit and the scope of the present disclosure. Accordingly, the aspects disclosed in the present disclosure are not intended to limit the technical ideas of the present disclosure, but rather to explain the technical ideas, and the scope of the technical ideas of the present disclosure is not limited by these aspects. Therefore, the aspects described above should be understood in all respects as illustrative and not restrictive. The scope of the present disclosure should be interpreted in accordance with the claims, and all technical ideas within the equivalent scope should be interpreted as being included in the scope of the present disclosure.

What is claimed is:

1. A display device comprising:

a display panel;

a gate driving circuit having a plurality of stages for providing a gate signal to the display panel; and a power supply configured to sequentially apply first to third discharge signals in a power off mode in which the gate driving circuit is powered off, wherein an N-th stage among the stages comprises:

a pull-up transistor with a gate electrode connected to a Q node, configured to output a high-voltage gate signal through a gate signal output node according to a voltage of the Q node in a driving mode in which the gate signal is output;

a pull-down transistor with a gate electrode connected to a QB node, connected to the pull-up transistor through the gate signal output node and configured to output a low-voltage gate signal through the gate signal output node according to a voltage of the QB node in the driving mode and to discharge the gate signal output node in response to the second discharge signal applied to the QB node in the power off mode;

a Q node discharge transistor configured to charge and discharge the Q node and the QB node in opposite manners according to the voltage of the QB node in the driving mode and to discharge the Q node in response to the second discharge signal applied to the QB node in the power off mode; and a QB node discharge transistor configured to discharge the QB node in response to the third discharge signal in the power off mode, and where N is a positive integer.

2. The display device of claim 1, wherein the N-th stage further comprises:

a pull-up carry transistor with a gate electrode connected to the Q node, configured to output a high-voltage carry signal through a carry signal output node according to the voltage of the Q node in the driving mode; and a pull-down carry transistor with a gate electrode connected to the QB node, connected to the pull-up carry transistor through the carry signal output node and configured to output a low-voltage carry signal through the carry signal output node according to the voltage of the QB node in the driving mode and to discharge the carry signal output node in response to the second discharge signal applied to the QB node in the power off mode.

3. The display device of claim 2, further comprising a power line connected to the pull-down transistor, the pull-down carry transistor, the Q node discharge transistor, and the QB node discharge transistor, wherein low-voltage power is for being applied to the power line in the driving mode, and the first discharge signal is for being applied to the power line when the gate driving circuit is powered off.

4. The display device of claim 1, wherein the first discharge signal is applied to all input terminals of the N-th stage when the gate driving circuit is powered off.

5. The display device of claim 1, wherein the first to third discharge signals have a same high voltage level and are sequentially applied with a preset time difference between the first to third discharge signals.

6. The display device of claim 1, wherein the power supply is configured to apply the first discharge signal to all input terminals of the N-th stage for a first time when the gate driving circuit is powered off, apply the second discharge signal to the QB node for a second time when application of the first discharge signal is completed, and apply the third discharge signal to a gate electrode of the QB node discharge transistor for a third time when application of the second discharge signal is completed.

7. The display device of claim 6, wherein the first time, the second time, and the third time are set to a same time period.

8. The display device of claim 6, wherein the input terminals include a start signal/carry signal (VST/CRY) input terminal, a high-voltage power (VDD) input terminal, a clock signal (CLK) input terminal, a stable signal (Stable) input terminal, a first low-voltage power (VSS) input terminal, and a second low-voltage power (VGL) input terminal.

9. The display device of claim 1, wherein the power supply is configured to apply high-voltage power to a power input terminal of the QB node in the driving mode, and apply the second discharge signal to the QB node when the gate driving circuit is powered off.

10. The display device of claim 1, wherein the Q node discharge transistor comprises:

a gate electrode to which the second discharge signal is for being input;

a first electrode connected to the Q node; and a second electrode connected to a power line through which low-voltage power is for being input in the driving mode and the first discharge signal is for being input when the gate driving circuit is powered off.

11. The display device of claim 1, wherein the QB node discharge transistor comprises:

a gate electrode to which the third discharge signal is input;

a first electrode connected to the QB node; and a second electrode connected to a power line through which low-voltage power is input in the driving mode and the first discharge signal is input when the gate driving circuit is powered off.

12. A method of controlling a display device including a display panel and a gate driving circuit having a plurality of stages for providing a gate signal to the display panel, the method comprising:

when the gate driving circuit is powered off, applying a first discharge signal to all input terminals of the gate driving circuit;

discharging a Q node and a gate signal output node by applying a second discharge signal to a QB node of an N-th stage included in the gate driving circuit; and applying a third discharge signal to a QB node discharge transistor of the N-th stage configured to discharge the QB node, where N is a positive integer, wherein the first discharge signal is in a high voltage state, and wherein the first to third discharge signals have a same high voltage level and are sequentially applied with a preset time difference between the first to third discharge signals.

13. The method of claim 12, wherein the input terminals include a start signal/carry signal (VST/CRY) input terminal, a high-voltage power (VDD) input terminal, a clock signal (CLK) input terminal, a stable signal (Stable) input terminal, a first low-voltage power (VSS) input terminal, and a second low-voltage power (VGL) input terminal.

14. A method of controlling a display device including a display panel and a gate driving circuit having a plurality of stages for providing a gate signal to the display panel, the method comprising:

when the gate driving circuit is powered off, applying a first discharge signal to all input terminals of the gate driving circuit;

discharging a Q node and a gate signal output node by applying a second discharge signal to a QB node of an N-th stage included in the gate driving circuit; and applying a third discharge signal to a QB node discharge transistor of the N-th stage configured to discharge the QB node, where N is a positive integer, and wherein the N-th stage comprises:

a pull-up transistor with a gate electrode connected to the Q node, configured to output a high-voltage gate signal through the gate signal output node according to a voltage of the Q node in a driving mode in which the gate signal is output;

a pull-down transistor with a gate electrode connected to the QB node, connected to the pull-up transistor through the gate signal output node and configured to output a low-voltage gate signal through the gate signal output node according to a voltage of the QB node in the driving mode and to discharge the gate signal output node in response to the second discharge signal applied to the QB node in a power off mode in which the gate driving circuit is powered off;

a Q node discharge transistor configured to charge and discharge the Q node and the QB node in opposite manners according to the voltage of the QB node in the driving mode and to discharge the Q node in response to the second discharge signal applied to the QB node in the power off mode; and a QB node discharge transistor configured to discharge the QB node in response to the third discharge signal in the power off mode.

15. The method of claim 14, wherein the N-th stage further comprises:

a pull-up carry transistor with a gate electrode connected to the Q node, configured to output a high-voltage carry signal through a carry signal output node according to the voltage of the Q node in the driving mode; and a pull-down carry transistor with a gate electrode connected to the QB node, connected to the pull-up carry transistor through the carry signal output node and configured to output a low-voltage carry signal through the carry signal output node according to the voltage of the QB node in the driving mode and to discharge the carry signal output node in response to the second discharge signal applied to the QB node in the power off mode.

* * * * *